United States Patent
Brogan et al.

(10) Patent No.: US 12,012,667 B2
(45) Date of Patent: Jun. 18, 2024

(54) COPPER ELECTROFILL ON NON-COPPER LINER LAYERS

(71) Applicant: Lam Research Corporation, Fremont, CA (US)

(72) Inventors: Lee J. Brogan, Newberg, OR (US); Jonathan David Reid, Sherwood, OR (US); Yi Hua Liu, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/045,657

(22) PCT Filed: Apr. 5, 2019

(86) PCT No.: PCT/US2019/026135
§ 371 (c)(1),
(2) Date: Oct. 6, 2020

(87) PCT Pub. No.: WO2019/199614
PCT Pub. Date: Oct. 17, 2019

(65) Prior Publication Data
US 2021/0156045 A1    May 27, 2021

Related U.S. Application Data

(60) Provisional application No. 62/655,129, filed on Apr. 9, 2018.

(51) Int. Cl.
*C25D 3/38* (2006.01)
*C25D 5/02* (2006.01)
(Continued)

(52) U.S. Cl.
CPC ........... *C25D 3/38* (2013.01); *C25D 5/02* (2013.01); *C25D 5/34* (2013.01); *C25D 7/123* (2013.01); *C25D 17/001* (2013.01); *C25D 21/12* (2013.01)

(58) Field of Classification Search
CPC ........................................... C25D 3/38
See application file for complete search history.

(56) References Cited

U.S. PATENT DOCUMENTS 6,140,241 A   10/2000  Shue et al.
6,444,110 B2   9/2002  Barstad et al.
(Continued)

FOREIGN PATENT DOCUMENTS

GB      2097020 B      6/1984
JP   2009-277772 A    11/2009
(Continued)

OTHER PUBLICATIONS

WO International Search Report and Written Opinion issued in Application No. PCT/US2019/026135 dated Jul. 22, 2019.
(Continued)

*Primary Examiner* — Stefanie S Wittenberg
(74) *Attorney, Agent, or Firm* — Weaver Austin Villeneuve & Sampson LLP

(57) ABSTRACT

Void-free bottom-up fill of copper in features is achieved on non-copper liner layers. A non-copper liner layer has a higher resistivity than copper. An electroplating solution for plating copper on a non-copper liner layer includes a low copper concentration, high pH, organic additives, and bromide ions as a copper complexing agent. The high pH and the bromide ions do not interfere with the activity of the organic additives. In some implementations, the concentration of copper ions is between about 0.2 g/L and about 10 g/L, a concentration of sulfuric acid is between about 0.1 g/L and about 10 g/L, and a concentration of the bromide ions is between about 20 mg/L and about 240 mg/L. In some implementations, the electroplating solution further includes chloride ions as an additional copper complexing agent at a concentration between about 0.1 mg/L and about 100 mg/L.

11 Claims, 9 Drawing Sheets

(51) Int. Cl.
- C25D 5/34 (2006.01)
- C25D 7/12 (2006.01)
- C25D 17/00 (2006.01)
- C25D 21/12 (2006.01)

(56) References Cited

U.S. PATENT DOCUMENTS

| | | |
|---|---|---|
| 6,527,920 B1 | 3/2003 | Mayer et al. |
| 6,551,483 B1 | 4/2003 | Mayer et al. |
| 6,551,487 B1 | 4/2003 | Reid et al. |
| 6,673,226 B1 | 1/2004 | Kogan et al. |
| 6,679,983 B2 | 1/2004 | Morrissey et al. |
| 7,232,513 B1 | 6/2007 | Webb et al. |
| 7,449,099 B1* | 11/2008 | Mayer .................. H05K 3/243 438/685 |
| 8,268,155 B1 | 9/2012 | Zhou et al. |
| 10,214,826 B2 | 2/2019 | Zhou et al. |
| 2001/0047943 A1 | 12/2001 | Barstad et al. |
| 2002/0000382 A1* | 1/2002 | Morrissey ............. C25D 7/123 205/291 |
| 2002/0011415 A1 | 1/2002 | Hey et al. |
| 2004/0016647 A1 | 1/2004 | Yang et al. |
| 2004/0245107 A1 | 12/2004 | Che et al. |
| 2005/0020068 A1 | 1/2005 | Wang et al. |
| 2006/0175201 A1 | 8/2006 | Hafezi et al. |
| 2006/0266655 A1 | 11/2006 | Sun et al. |
| 2007/0012576 A1 | 1/2007 | Binstead et al. |
| 2007/0099422 A1* | 5/2007 | Wijekoon ............. C23C 18/40 438/687 |
| 2007/0178697 A1 | 8/2007 | Paneccasio, Jr. et al. |
| 2007/0256937 A1 | 11/2007 | Basker et al. |
| 2009/0038951 A1 | 2/2009 | Hayashi et al. |
| 2009/0139870 A1 | 6/2009 | Nagai et al. |
| 2009/0283413 A1 | 11/2009 | Sato |
| 2010/0012500 A1 | 1/2010 | Lachowicz et al. |
| 2010/0126872 A1 | 5/2010 | Paneccasio, Jr. et al. |
| 2010/0300888 A1 | 12/2010 | Ponnuswamy et al. |
| 2011/0284386 A1* | 11/2011 | Willey .................. C25D 3/38 205/96 |
| 2012/0097547 A1 | 4/2012 | Vereecken et al. |
| 2012/0152749 A1 | 6/2012 | Yasuda et al. |
| 2012/0211369 A1 | 8/2012 | Park et al. |
| 2013/0098770 A1 | 4/2013 | Niazimbetova et al. |
| 2013/0320609 A1 | 12/2013 | Keane et al. |
| 2014/0197038 A1 | 7/2014 | Park et al. |
| 2014/0209476 A1 | 7/2014 | Zhou et al. |
| 2015/0376807 A1 | 12/2015 | Thorseth et al. |
| 2016/0102416 A1 | 4/2016 | Zhou et al. |
| 2016/0258078 A1* | 9/2016 | Thorum ............. C25D 17/001 |
| 2017/0370014 A1* | 12/2017 | Pokhrel ............. C25D 7/00 |
| 2019/0145017 A1 | 5/2019 | Zhou et al. |

FOREIGN PATENT DOCUMENTS

| | | |
|---|---|---|
| KR | 10-0616198 B1 | 8/2006 |
| KR | 10-2011-0096138 A | 8/2011 |
| KR | 20110127617 A | 11/2011 |
| KR | 20120100947 A | 9/2012 |
| KR | 20160019960 A | 2/2016 |
| TW | 2008/33879 A | 8/2008 |
| TW | 201443295 A | 11/2014 |
| WO | WO99/54527 A3 | 10/1999 |
| WO | WO2008/029376 A2 | 3/2008 |
| WO | WO2011036158 A2 | 3/2011 |

OTHER PUBLICATIONS

U.S. Office Action date Oct. 23, 2014 issued in U.S. Appl. No. 13/753,333.
U.S. Final Office Action dated May 21, 2015 issued in U.S. Appl. No. 13/753,333.
U.S. Office Action dated Feb. 9, 2016 issued in U.S. Appl. No. 13/753,333.
U.S. Office Action dated Sep. 22, 2016 issued in U.S. Appl. No. 13/753,333.
U.S. Final Office Action dated May 16, 2017 issued in U.S. Appl. No. 13/753,333.
U.S. Office Action dated Oct. 30, 2017 issued in U.S. Appl. No. 13/753,333.
U.S. Final Office Action dated May 15, 2018 issued in U.S. Appl. No. 13/753,333.
U.S. Notice of Allowance dated Oct. 30, 2018 issued in U.S. Appl. No. 13/753,333.
U.S. Office Action dated Jul. 22, 2019 issued in U.S. Appl. No. 16/154,243.
U.S. Final Office Action dated Feb. 13, 2020 issued in U.S. Appl. No. 16/154,243.
U.S. Office Action dated Jun. 25, 2020 issued in U.S. Appl. No. 16/154,243.
U.S. Office Action dated Jul. 14, 2017 issued in U.S. Appl. No. 14/968,662.
U.S. Final Office Action dated Feb. 12, 2018 issued in U.S. Appl. No. 14/968,662.
U.S. Advisory Action dated May 2, 2018 issued in U.S. Appl. No. 14/968,662.
U.S. Office Action dated Jun. 26, 2018 issued in U.S. Appl. No. 14/968,662.
U.S. Final Office Action dated Feb. 1, 2019 issued in U.S. Appl. No. 14/968,662.
Taiwanese First Office Action dated Dec. 6, 2017 issued in Application No. TW 103103593.
Taiwanese Second Office Action dated Mar. 22, 2018 issued in Application No. TW 103103593.
Korean First Office Action dated Aug. 13, 2020 issued in Application No. KR 10-2014-0011809.
Korean Decision for Grant dated Feb. 4, 2021 issued in Application No. KR 10-2014-0011809.
Korean First Office Action dated May 25, 2021 issued in Application No. KR 10-2021-0056900.
Korean Decision for Grant dated Nov. 15, 2021 issued in Application No. KR 10-2021-0056900.
International Preliminary Report on Patentability dated Oct. 22, 2020 issued in Application No. PCT/US2019/026135.
Long et al. (2006) "Electrochemical Characterization of Adsorption-Desorption of the Cuprous-Suppressor-Chloride Complex during Electrodeposition of Copper," Journal of The Electrochemical Society, 153(4):C258-C264 [Downloaded on Dec. 4, 2012].
CN Office Action dated Feb. 10, 2023 in Application No. CN201980033374.4 with English translation.
Huang. Q, et al., "Enhanced Grain Growth of Electroplated Copper on Cobalt-containing Seed Layer", Journal of The Electrochemical Society, vol. 160, No. 12, 2013, pp. D3045-D3050.
Radisic. A, et al., "Copper Plating on Resistive Substrates, Diffusion Barrier and Alternative Seed Layers", The Electrochemical Society, 2009, 2 pages.
TW Office Action dated Nov. 9, 2022, in Application No. TW108112120 with English Translation.
Xu. W-Z, et al., "Direct Copper Electrodeposition Onto Cobalt Adhesion Layer in Alkaline Bath", IEEE, 2012, 3 Pages.
CN Office Action dated Jan. 9, 2024 in CN Application No. 201980033374.4 with English translation.
CN Office Action dated Aug. 17, 2023, in Application No. CN201980033374.4 with English translation.
KR Office Action dated Mar. 19, 2024 in KR Application No. 10-2020-7032242, with English Translation.

* cited by examiner

Increasing deposition time →

Increasing deposition time →

COPPER ELECTROFILL ON NON-COPPER LINER LAYERS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Formation of metal wiring interconnects in integrated circuits (ICs) can be achieved using a damascene or dual damascene process. Typically, trenches or holes are etched into dielectric material, such as silicon dioxide, located on a substrate. The holes or trenches may be lined with one or more liner layers and barrier layers. Then a thin layer of copper may be deposited in the holes or trenches that can act as a copper seed layer. Thereafter, the holes or trenches may be filled with copper.

Conventional copper deposition typically occurs in two steps. First, a copper seed layer is deposited on the substrate using a PVD process. Second, copper is electroplated on the seed layer to fill the holes or trenches. Techniques have been developed that avoid depositing a copper seed layer using PVD by directly electroplating copper on barrier or liner layers. However, challenges exist in directly electroplating copper on barrier or liner layers.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of electroplating copper onto a surface of a wafer. The method includes receiving a wafer having a plurality of features and a non-copper liner layer at the surface of the wafer and contacting the surface of the wafer with electroplating solution. The electroplating solution includes copper ions at a concentration in the electroplating solution between about 0.2 g/L and about 10 g/L, an accelerator additive, a suppressor additive, and bromide ions. The pH of the electroplating solution is greater than about 1.0. The method further includes electroplating copper onto the non-copper liner layer to fill the plurality of features with copper.

In some implementations, the electroplating solution further includes a leveler additive. In some implementations, a concentration of the bromide ions in the electroplating solution is between about 20 mg/L and about 240 mg/L. In some implementations, the non-copper liner layer includes cobalt or ruthenium. In some implementations, the electroplating solution includes sulfuric acid at a concentration in the electroplating solution between about 0.1 g/L and about 10 g/L. In some implementations, the electroplating solution further includes chloride ions at a concentration in the electroplating solution between about 1 mg/L and about 100 mg/L. The plurality of features filled with copper is free of or substantially free of voids. In some implementations, the method further includes applying, before or upon contacting the surface of the wafer with the electroplating solution, a constant potential between about −400 mV and about −2000 mV relative to Hg/HgSO4 to the wafer. In some implementations, the method further includes applying, when electroplating copper onto the non-copper liner layer, a constant current to the wafer at a current density between about 0.2 mA/cm$^2$ and about 5 mA/cm$^2$. In some implementations, the electroplating solution is configured to induce a cathodic overpotential on the non-copper liner layer sufficient to prevent dissolution of the non-copper liner layer. Electroplating the copper onto the non-copper liner layer occurs without depositing a copper seed layer.

Another aspect involves a copper electroplating solution for electroplating copper onto a surface of a wafer having a plurality of features and a non-copper liner layer. The electroplating solution includes copper ions at a concentration in the copper electroplating solution between about 0.2 g/L and about 5 g/L, an accelerator additive, a suppressor additive, bromide ions at a concentration in the copper electroplating solution between about 20 mg/L and about 240 mg/L, chloride ions at a concentration in the copper electroplating solution between about 1 mg/L and about 100 mg/L, and sulfuric acid at a concentration in the copper electroplating solution between about 0.1 g/L and about 10 g/L.

In some implementations, the copper electroplating solution includes a leveler additive. In some implementations, a concentration of the suppressor additive is between about 30 ppm and about 300 ppm. In some implementations, a concentration of the accelerator additive is between about 5 ppm and about 40 ppm. In some implementations, the concentration of the chloride ions is between about 10 mg/L and about 80 mg/L, and the concentration of the sulfuric acid is between about 0.5 g/L and about 5 g/L. In some implementations, the chloride ions serve as a first complexing agent for the copper ions and the bromide ions serve as a second complexing agent for the copper ions.

These and other aspects are described further below with reference to the drawings.

DETAILED DESCRIPTION

Figure 1:
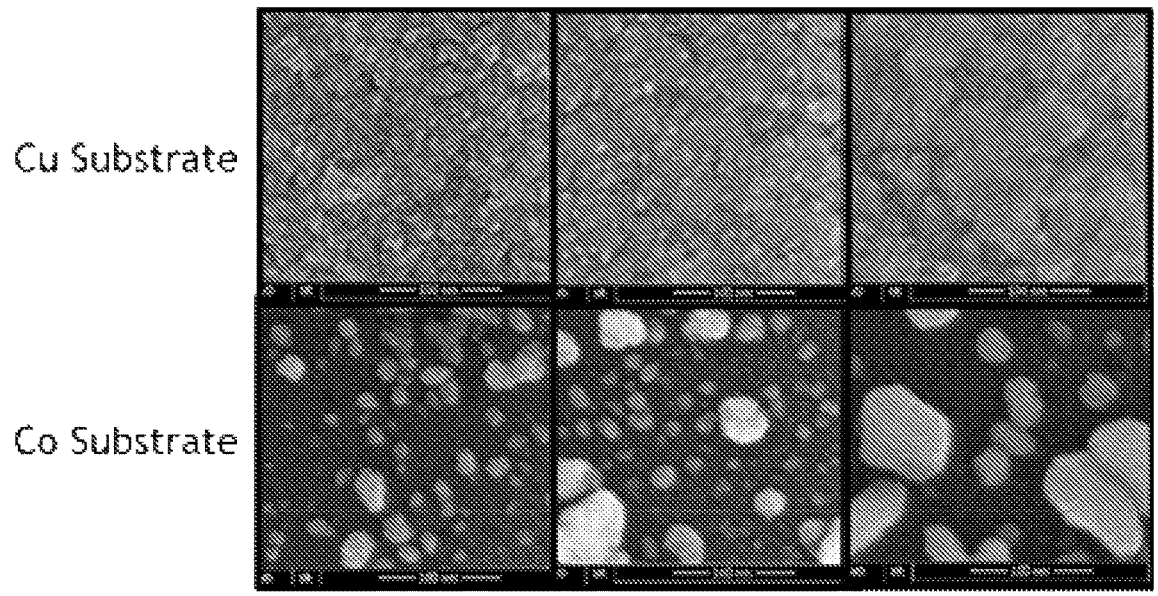
FIG. 1 shows scanning electron microscopy (SEM) images of nucleation of copper on a copper substrate and SEM images of nucleation of copper on a cobalt substrate.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution," and "electroplating solution" are used interchangeably. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Electrolytes or electroplating solutions used in electroplating copper onto a seed layer in damascene interconnects typically contain a copper salt, an acid, halide ions, an accelerator, a suppressor and a leveler. The copper salt is the copper source for the deposition. Example copper salts include, but are not limited to, copper sulfate, copper methanesulfonate, copper pyrophosphate, copper propanesulfonate, etc. As used herein, the concentration of copper ions reflects the concentration (mass per volume) of copper cations, and does not include the mass of any anions associated with the copper cations. Acid is generally used to control the conductivity of the plating bath. Example acids include, but are not limited to, sulfuric acid and methane sulfonic acid. As used herein, the concentration of acid reflects the concentration (mass per volume) of the entire acid molecule, not the mass of hydrogen cations alone. Halide ions may act as bridges to assist the adsorption of certain organic additives (e.g., accelerator, suppressor, and/or leveler) onto a substrate surface, which encourage a conventional bottom-up fill mechanism, described below. Example halide ions include but are not limited to chloride ions, bromide ions, iodide ions, and combinations thereof.

Organic additives may be important in achieving a desired metallurgy, film uniformity, defect control, and fill performance. Typically, the copper electroplating solution includes organic bath additives to permit controlled high quality electrofill of recesses in damascene features. Such additives typically include a suppressor and an accelerator and possibly a leveler. One role of the suppressor is to suppress electroplating and increase the surface polarization of the plating substrate. As used herein, many additive concentrations are recited in parts per million (ppm). This unit is equivalent to mg/L for the purpose of determining additive concentration in solution. A discussion of plating additives is presented below.

Suppressors

While not wishing to be bound to any theory or mechanism of action, it is believed that suppressors (either alone or in combination with other bath additives) are surface-kinetic polarizing compounds that lead to a significant increase in the voltage drop across the substrate-electrolyte interface, especially when present in combination with a surface chemisorbing halide (e.g., chloride or bromide). The halide may act as a bridge between the suppressor molecules and the wafer surface.

The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not incorporated into the deposited film, though they may slowly degrade over time. Suppressors are often relatively large molecules, and in many instances they are polymeric in nature (e.g., polyethylene oxide, polypropylene oxide, polyethylene glycol, polypropylene glycol, etc). Other examples of suppressors include polyethylene and polypropylene oxides with S- and/or N-containing functional groups, block polymers of polyethylene oxide and polypropylene oxides, etc. The suppressors can have linear chain structures or branch structures. It is common that suppressor molecules with various molecular weights co-exist in a commercial suppressor solution. Due in part to suppressors' large size, the diffusion of these compounds into a recessed feature is relatively slow.

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator). Example accelerators include, but are not limited to, dimercaptopropane sulfonic acid, dimercaptoethane sulfonic acid, mercaptopropane sulfonic acid, mercaptoethane sulfonic acid, bis-(3-sulfopropyl) disulfide (SPS), and their derivatives. Although the accelerator may become strongly adsorbed to the substrate surface and generally laterally-surface immobile as a result of the plating reactions, the accelerator is generally not incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

Levelers

While not wishing to be bound by any theory or mechanism of action, it is believed that levelers (either alone or in combination with other bath additives) act as suppressing agents to counteract the depolarization effect associated with accelerators, especially in the field region and at the side walls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that the leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be especially useful. Leveler compounds may also include ethoxide groups. For example, the leveler may include a general backbone similar to that found in polyethylene glycol or polyethyelene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be especially useful. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Bottom-Up Fill

In the bottom-up fill mechanism, a recessed feature on a plating surface tends to be plated with metal from the bottom to the top of the feature, and inward from the sidewalls towards the center of the feature. It is important to control the deposition rate within the feature and in the field region in order to achieve uniform filling and avoid incorporating voids into the features. The three types of additives described above are beneficial in accomplishing bottom-up fill, each working to selectively increase or decrease the polarization at the substrate surface.

After the substrate is immersed in electrolyte, the suppressor adsorbs onto the surface of the substrate, especially in exposed regions such as the field region. At the initial plating stages, there is a substantial differential in suppressor concentration between the top and bottom of a recessed feature. This differential is present due to the relatively large size of the suppressor molecule and its correspondingly slow transport properties. Over this same initial plating time, it is believed that accelerator accumulates at a low, substantially uniform concentration over the entire plating surface, including the bottom and side walls of the feature. Because the accelerator diffuses into features more rapidly than the suppressor, the initial ratio of accelerator:suppressor within the feature (especially at the feature bottom) is relatively high. The relatively high initial accelerator:suppressor ratio within the feature promotes rapid plating from the bottom of the feature upwards and from the sidewalls inwards. Meanwhile, the initial plating rate in the field region is relatively low due to the lower ratio of accelerator:suppressor. Thus, in the initial plating stages, plating occurs relatively faster within the feature and relatively slower in the field region.

As plating continues, the feature fills with metal and the surface area within the feature is reduced. Because of the decreasing surface area and the accelerator substantially remaining on the surface, the local surface concentration of accelerator within the feature increases as plating continues. This increased accelerator concentration within the feature helps maintain the differential plating rate beneficial for bottom-up fill.

In the later stages of plating, particularly as overburden deposits, the accelerator may build up in certain regions (e.g., above filled features) undesirably, resulting in local faster-than-desired plating. Leveler may be used to counteract this effect. The surface concentration of leveler is greatest at exposed regions of a surface (i.e., not within recessed features) and where convection is greatest. It is believed that the leveler displaces accelerator, increases the local polarization and decreases the local plating rate at regions of the surface that would otherwise be plating at a rate greater than at other locations on the deposit. In other words, the leveler tends, at least in part, to reduce or remove the influence of an accelerating compound at the exposed regions of a surface, particularly at protruding structures. Without leveler, a feature may tend to overfill and produce a bump. Therefore, in the later stages of bottom-up fill plating, levelers are beneficial in producing a relatively flat deposit.

The use of suppressor, accelerator and leveler, in combination, may allow a feature to be filled without voids from the bottom-up while producing a relatively flat deposited surface. The exact identity/composition of the additive compounds are typically maintained as trade secrets by the additive suppliers, thus, information about the exact nature of these compounds is not publicly available.

The electroplating solution of the present disclosure enables the distribution of the organic additives to promote void-free bottom-up filling of copper. The electroplating solution does not interfere with the activity of the organic additives so that features may be filled without voids and from the bottom-up.

Electroplating Copper on a Non-Copper Layer

The present disclosure relates to electroplating of copper on a non-copper layer to fill features with copper. In some implementations, a non-copper layer can include a conductive liner material such as ruthenium (Ru), cobalt (Co), or other suitable liner material, where the non-copper layer is a liner layer. As used herein, the non-copper layer may also be referred to as a "non-copper seed layer," "non-copper seed," "non-copper liner layer," or "non-copper liner." The conductive liner material may be more electrically resistive than copper. The liner layer may be deposited by any suitable deposition technique such as physical vapor deposition (PVD), chemical vapor deposition (CVD), atomic layer deposition (ALD), or electroless deposition (ELD). The liner layer may be deposited on a barrier layer that serves to prevent or minimize diffusion of copper into underlying insulating material. Examples of barrier layers include tantalum (Ta), titanium (Ti), tantalum nitride (TaN), titanium nitride (TiN), and fluorine-free tungsten (FFW).

Electroplating copper on a copper layer such as a copper seed layer does not present as many challenges as electroplating copper on a non-copper layer. Typically, plating on non-copper layers is accomplished by a two-step process, where a copper seed layer is first deposited followed by bulk electroplating of copper on the copper seed layer. In some instances, separate deposition processes are performed. For example, a copper seed layer is deposited by PVD on a non-copper layer and bulk copper is deposited by electroplating on the copper seed layer. In some instances, different electroplating solutions are used in electroplating copper on the non-copper layer where a copper seed layer is deposited with a first electroplating solution and bulk copper is deposited on the copper seed layer using a second electroplating solution. Relying on a two-step process for electroplating copper on a non-copper layer increases cost, increases processing time, and increases the risk of pinch-off due to a sub-conformal copper seed layer. Sub-conformal or non-uniform copper seed layer coverage is more intractable as the critical dimensions of damascene interconnects decrease. Non-uniform plating and defects may be introduced during copper electrofill when there is a sub-conformal or non-uniform copper seed layer.

The present disclosure performs copper electrofill on a non-copper layer or a non-copper seed without discrete operations for (i) depositing a copper seed layer and (ii) performing a bulk copper electrofill on the copper seed layer. An electrolyte or electroplating solution is provided that effectively nucleates copper on the non-copper layer, achieves void-free bottom-up fill of copper in recessed features, and achieves substantial deposition uniformity of copper across a wafer surface.

Nucleation of copper on a non-copper layer usually presents several challenges. Electrical current is applied to a substrate immersed in an electrolyte to promote nucleation, thereby forming three-dimensional copper "islands" or "grains." The copper islands continue to grow until they coalesce into a continuous copper film. Generally, deposition of copper on an existing copper nucleus is more kinetically favorable than generation of new copper nucleus. Thus, nucleation of copper on a non-copper layer is not kinetically favorable. Nucleating copper on a non-copper layer produces sparse copper islands or grains across the non-copper layer, resulting in uneven fill and poor adhesion.

FIG. 1 shows SEM images of copper nucleation on a copper substrate and SEM images of copper nucleation on a cobalt substrate. In FIG. 1, nucleation of copper is kinetically favorable on a copper substrate and results in a more continuous film than on a cobalt substrate. In contrast, nucleation of copper is kinetically unfavorable on the cobalt substrate and results in sparse grains across the cobalt substrate.

In some non-copper layers, dissolution of the non-copper layer is possible without a sufficient overpotential. An overpotential of the electroplating solution that is greater than a dissolution potential of the non-copper layer prevents dissolution of the non-copper layer. The electroplating solution may exhibit a high overpotential (strong polarization) at a given current density to minimize dissolution of a non-copper seed. Thus, a higher overpotential provides better seed protection at a given current density. Better seed protection is especially beneficial for small features (e.g., <25 nm feature width) with thin seeds (e.g., thinner than about 100 Å) which may otherwise dissolve during plating, resulting in fill defects. A higher overpotential may be necessary where the non-copper layer includes a metal less noble than copper. Cobalt is less noble than copper and more prone to dissolution, and ruthenium is more noble than copper and not as prone to dissolution.

A higher overpotential not only reduces the effects of seed dissolution, but a higher overpotential promotes better nucleation. An electroplating solution with a higher overpotential provides higher nucleation density, which results in the formation of a continuous copper film instead of a discontinuous copper film.

One way to promote high nucleation density is to use solution conditions that lead to a more polarized electrode. Increased electrode polarization can be achieved by a number of methods. One such method may involve using certain complexing agents such as ethylenediaminetetraacetic acid (EDTA), nitrilotriacetic acid (NTA), citric acid, glutamic acid, etc. in the electrolyte. Complexing agents bind with copper ions by, e.g., electrostatic interactions and form a soluble complex. In various examples, complexing agents are shaped to partially enclose complexed copper ions and partially shield the copper ions. Although complexing agents are not suppressors because they principally act by forming complexes with copper in solution rather than by adsorbing onto the substrate surface, the complexing agents do serve a suppressor-like function by increasing the overpotential of copper electrodeposition. Complexing agents serve to increase the degree of polarization, or the potential required to reduce the copper ion to metal. Stronger complexing agents like EDTA assist in increasing the polarization of copper electrodeposition, thereby improving nucleation even on non-copper layers.

Figure 2:
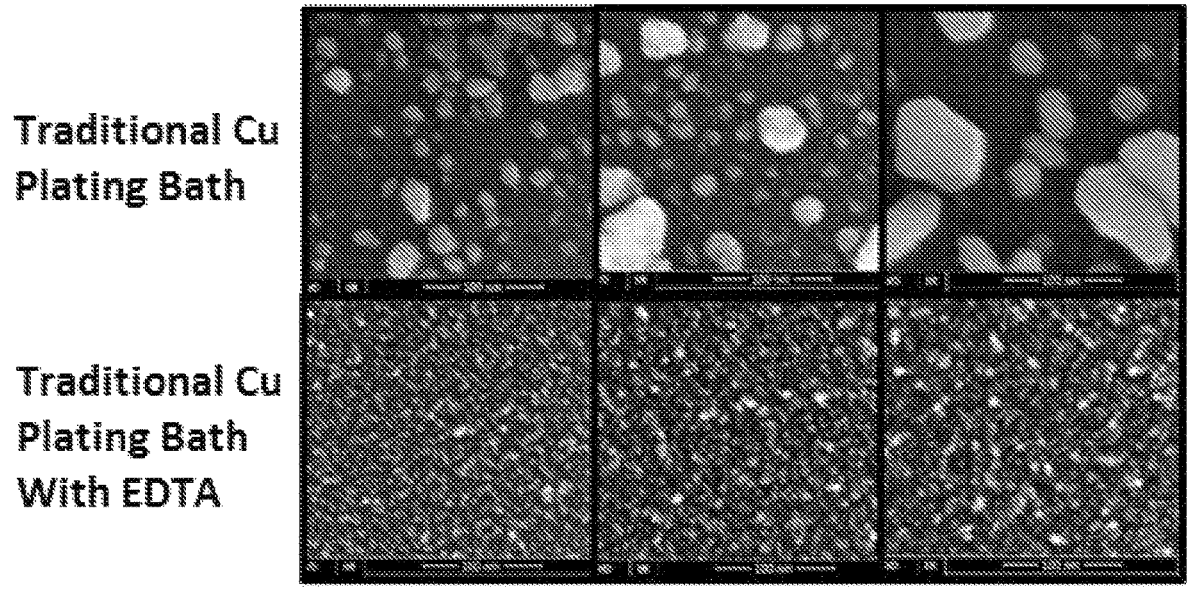
FIG. 2 shows SEM images of nucleation of copper on a cobalt substrate using a conventional copper electroplating solution and nucleation of copper on a cobalt substrate using a conventional copper electroplating solution with ethylene diaminetetraacetic acid (EDTA).

FIG. 2 shows SEM images of copper nucleation on a cobalt substrate using a conventional copper electroplating solution and copper nucleation on a cobalt substrate using a copper electroplating solution with EDTA. In FIG. 2, nucleation of copper using a conventional copper electroplating solution without EDTA results in sparse copper islands across the cobalt substrate. In contrast, nucleation of copper using a copper electroplating solution with EDTA results in substantially improved nucleation of copper across the cobalt substrate.

Though strong complexing agents may promote copper nucleation even on non-copper layers, such complexing agents may adversely affect fill. As discussed above, organic additives including accelerators, suppressors, and/or levelers may be incorporated in an electroplating solution to control a deposition rate of copper in a feature. Controlling the activity and concentration of the accelerators, suppressors, and/or levelers serves to achieve void-free bottom-up fill. However, many complexing agents interfere with organic additive activity so that the electroplating of copper does not occur in a bottom-up manner. In certain instances, the electroplating of copper is more conformal rather than bottom-up. In the context of damascene plating, conformal films are undesirable because they can lead to the incorporation of seams/voids inside features.

Figure 3:
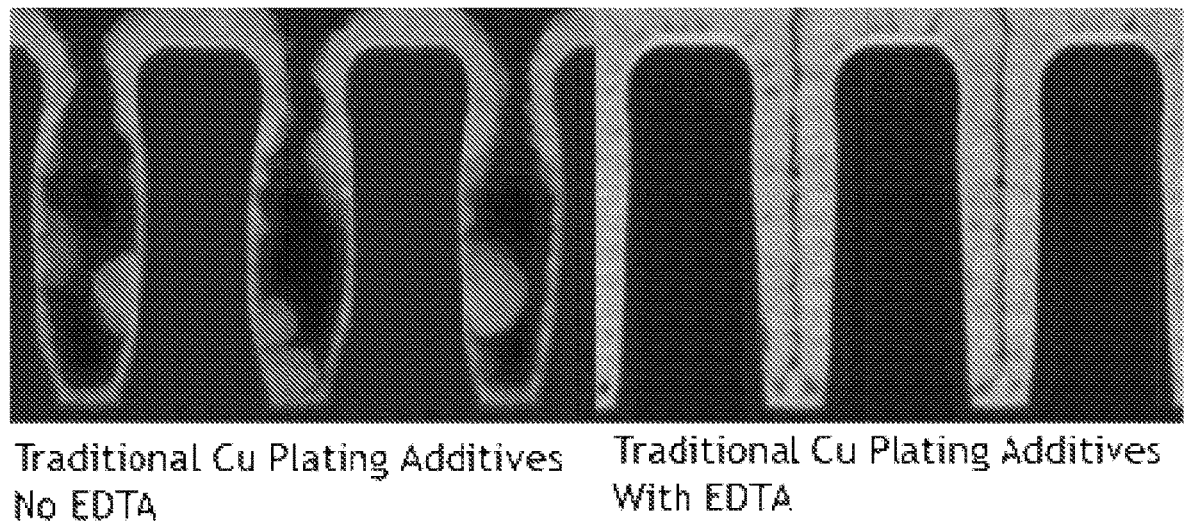
FIG. 3 shows scanning transmission electron microscopy (STEM) images of copper fill in features lined with cobalt using conventional copper electroplating solution and copper fill in features lined with cobalt using conventional copper electroplating solution with EDTA.

FIG. 3 shows STEM images of copper fill in features lined with cobalt using conventional copper electroplating solution and copper fill in features lined with cobalt using conventional copper electroplating solution with EDTA. In FIG. 3, use of a copper electroplating solution without EDTA results in poor nucleation and poor fill in the feature lined with cobalt. In contrast, use of a copper electroplating solution with EDTA results in improved nucleation but fill becomes conformal rather than bottom-up as the EDTA interferes with organic additive activity. Conformal fill leads to seams/voids as shown in FIG. 3.

When electroplating begins, there is usually a significant potential drop between the edges of a substrate (where the substrate is connected to a power supply) and its center. The difference in potential results in faster plating at the edges and slow plating at the center of the substrate during an initial plating stage. The resulting film is generally edge-thick and center-thin, meaning that there may be significant plating non-uniformities between different areas on a substrate. This is known as the "terminal effect."

The terminal effect may be more pronounced when the substrate includes non-copper layers. This is because non-copper layers are generally more resistive than copper layers. In particular, a non-copper seed layer may cause the sheet resistance of an incoming substrate to be higher or substantially higher than if the substrate had a copper seed layer. The potential drop can be more substantial between the edge of the substrate and its center with a more resistive substrate. However, the strength of the terminal effect may be reduced by using lower conductivity plating baths. Lower electrolyte conductivity in the electroplating solution results in a less significant potential drop between the substrate edge and the substrate center.

Figure 4:
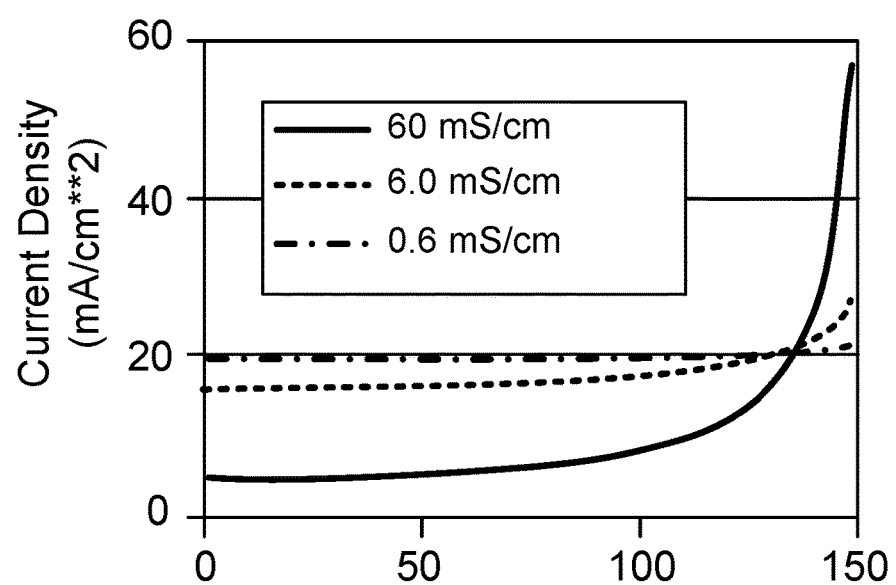
FIG. 4 shows a graph of current density as a function of distance from a center of a wafer for three different electroplating solutions.

FIG. 4 shows a graph of current density as a function of distance from a center of a wafer for three different electroplating solutions. The current profile delivered across the substrate may provide a relatively uniform or non-uniform current density on the substrate surface during immersion, thereby resulting in a uniform or non-uniform electroplating of copper across the substrate surface. A conductivity of an electroplating solution may influence the profile of current delivered to the substrate. In FIG. 4, a large difference in current density as a function of distance is produced with a more conductive solution (e.g., 60 mS/cm). The current density is low close to the center of the substrate and high close to where the substrate is connected to the power supply. On the other hand, a small difference in current density is produced with a less conductive solution (e.g., 0.6 mS/cm). Accordingly, the strength of the terminal effect is reduced as the conductivity of the electroplating solution decreases.

An electroplating solution of the present disclosure addresses the challenges posed by nucleation, bottom-up fill, and the terminal effect. The electroplating solution of the present disclosure effectively nucleates and performs bottom-up filling of copper on a non-copper layer in one or more features while mitigating the terminal effect.

One of the ways of promoting nucleation is by decreasing copper ion concentration. Electroplating solutions with low copper ion concentrations may be referred to as low copper electrolytes. A low concentration of copper ions is understood to mean a concentration of less than about 10 g/L copper ions. In some implementations, a low copper electrolyte has a concentration of copper ions less than about 10 g/L in the electroplating solution. Use of a low copper electrolyte increases the polarization on the non-copper layer and increases the overpotential of the electroplating solution. This may serve to promote nucleation of copper on the non-copper layer and protect the non-copper layer from dissolution. An electroplating solution of the present disclosure may have a concentration of copper ions between about 0.2 g/L and about 10 g/L or between about 0.2 g/L and about 5 g/L.

Another way of promoting nucleation as discussed above is by use of a complexing agent. Complexing agents increase the overpotential of the electroplating solution. Examples of complexing agents include EDTA, NTA, citric acid, glutamic acid, and halide ions such as bromide ions and chloride ions. However, complexing agents typically interfere with the activity of organic additives, thereby interfering with bottom-up filling processes and resulting in conformal films as shown in FIG. 3.

Figure 5:
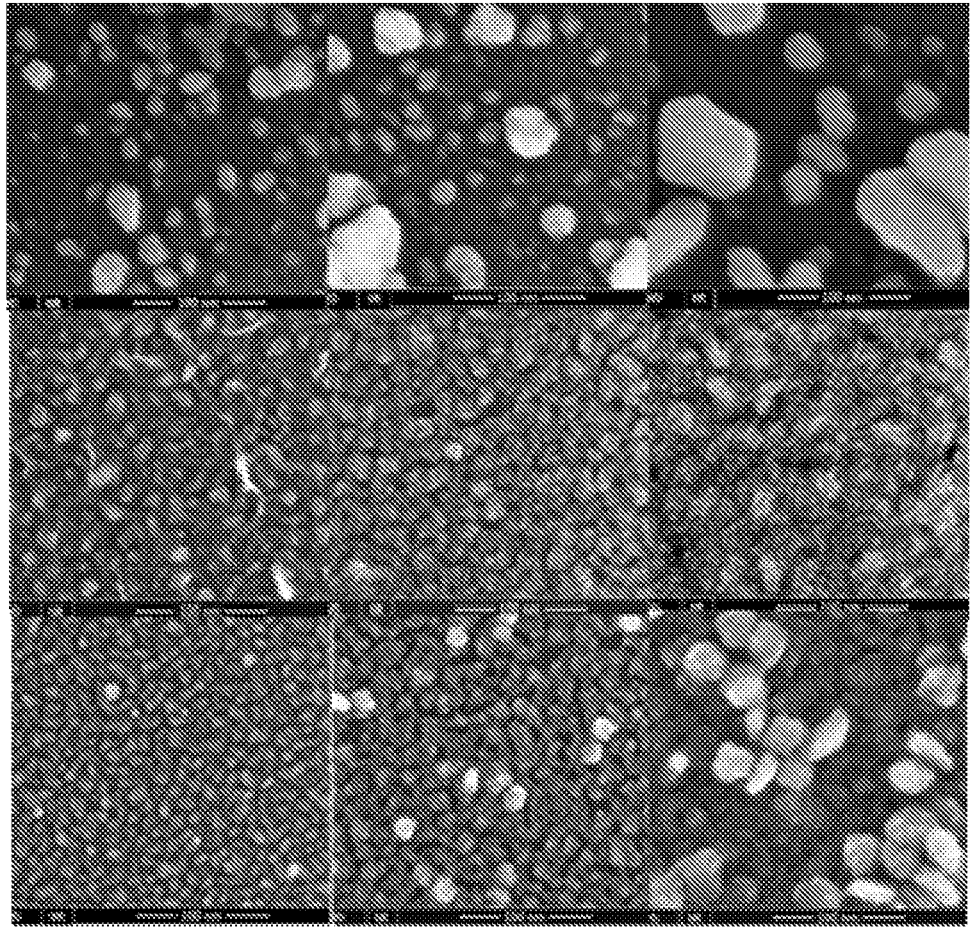
FIG. 5 shows SEM images of nucleation of copper with varying copper ion concentrations and varying bromide ion concentrations.

FIG. 5 shows SEM images of nucleation of copper with varying copper ion concentrations and varying bromide ion concentrations. With a concentration of copper ions being 2 g/L and without bromide ions in the electroplating solution, nucleation of copper was poor. With a decreased copper ion concentration at 0.5 g/L and without bromide ions in the electroplating solution, nucleation of copper was improved. With a concentration of copper ions being 2 g/L and with 1 mM of bromide ions in the electroplating solution, nucleation of copper was also improved. Therefore, a decreased copper ion concentration and the presence of bromide ions may improve nucleation of copper.

Surprisingly, a concentration of bromide ions sufficient to improve nucleation did not adversely affect bottom-up fill of copper. Whereas many other complexing agents such as EDTA interfere with organic additive activity and result in conformal deposition rather than bottom-up deposition, bromide ion as a complexing agent did not interfere with organic additive activity. In some implementations, an electroplating solution of the present disclosure includes bromide ions at a concentration in the electroplating solution between about 20 mg/L and about 240 mg/L.

In some implementations, the electroplating solution includes a second complexing agent in addition to bromide ion serving as a first complexing agent. The second complexing agent may further increase polarization of the plating surface for copper electroplating. For example, the second complexing agent may include chloride ion. The electroplating solution of the present disclosure may include chloride ions at a concentration in the electroplating solution between about 1 mg/L and about 100 mg/L.

Figure 6:
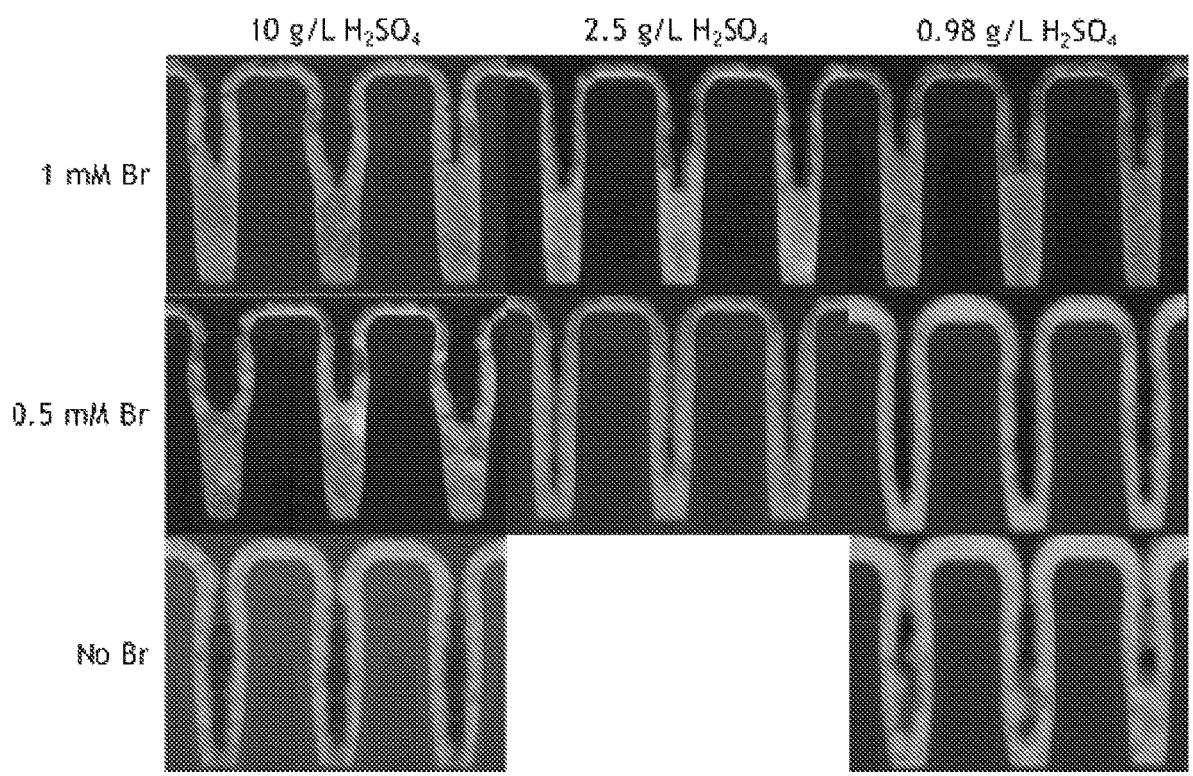
FIG. 6 shows STEM images of copper fill in features lined with cobalt using a low copper concentration electroplating solution with varying pH values and varying bromide ion concentrations.

FIG. 6 shows STEM images of copper fill in features lined with cobalt using a low copper electroplating solution with varying pH values and varying bromide ion concentrations. Without bromide ions, nucleation is poor regardless of whether the pH is low or high. With bromide ions at a concentration of 0.5 mM in the electroplating solution, nucleation improved and bottom-up filling was sufficient at high acid concentrations. With bromide ions at a concentration of 1 mM in the electroplating solution, nucleation improved and bottom-up filling was sufficient at both high acid concentrations and low acid concentrations. The addition of bromide ions improves nucleation and sustains void-free bottom-up filling even for higher pH values. This is achieved on a non-copper layer such as cobalt.

One of the ways of decreasing the conductivity of the electroplating solution is by decreasing acid concentration. In other words, higher pH values correlate to lower conductivity solutions, and lower conductivity solutions mitigate the terminal effect. The pH of the electroplating solution of the present disclosure is equal to or greater than 1.0, equal to or greater than 1.5, or equal to or greater than 2.0. In some implementations, the pH can be controlled by adjusting a concentration of sulfuric acid in the electroplating solution.

Figure 7:
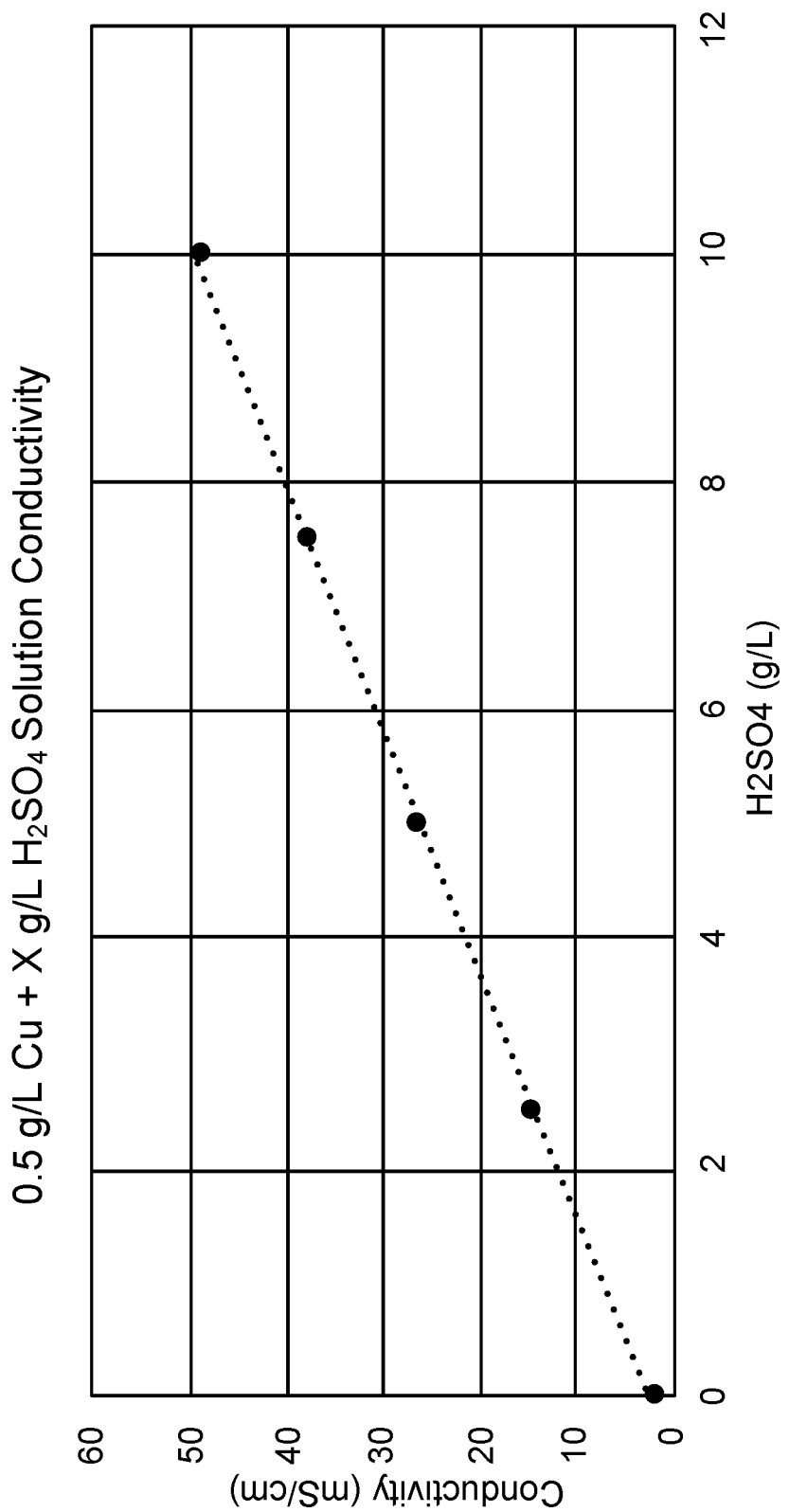
FIG. 7 shows a graph of electroplating solution conductivity as a function of sulfuric acid concentration.

FIG. 7 shows a graph of electroplating solution conductivity as a function of sulfuric acid concentration. The electroplating solution includes a fixed amount of copper ion concentration at 0.5 g/L but varying sulfuric acid concentrations. As the sulfuric acid concentration increases, conductivity of the electroplating solution linearly increases. Thus, lower acid concentrations allows for lower conductivity electroplating solutions, which helps mitigate across-wafer uniformity issues caused by the terminal effect.

However, in typical damascene plating, it is usually undesirable to have a high pH because higher pH values lead to interference with organic additive activity, resulting in poor bottom-up filling. Referring to the STEM images in FIG. 6, it was observed that decreasing acid concentration resulted in poor bottom-up filling for 0.5 mM bromide ions and for 0 mM bromide ions. As expected, increased pH values interfered with organic additive activity as shown in FIG. 6.

Surprisingly, increased bromide ion concentration combined with decreased acid concentration did not detrimentally affect bottom-up filling. Bromide ions served to improve nucleation and maintained effective bottom-up filling as shown in FIG. 6. Improved nucleation and fill was maintained even with decreasing acid concentration. In FIG. 6, nucleation and bottom-up filling was maintained at 10 g/L sulfuric acid, at 2.5 g/L sulfuric acid, and at 0.98 g/L sulfuric acid. It was observed that decreasing acid concentration and increasing bromide ion concentration resulted in improved bottom-up filling for 1 mM bromide ions.

The electroplating solution of the present disclosure may have a low acid concentration. For example, the electroplating solution may have an acid concentration between about 0.1 g/L and about 10 g/L or between about 0.5 g/L and about 5 g/L. Reduced acid concentrations correlate with higher pH values. The electroplating solution of the present disclosure may have a relatively high pH value such as pH values equal to or greater than about 1.0. In some implementations, the electroplating solution of the present disclosure includes an acid, such as sulfuric acid or methane sulfonic acid. Sulfuric acid may be at a concentration in the electroplating solution between about 0.1 g/L and about 10 g/L or between about 0.5 g/L and about 5 g/L.

Achieving good nucleation and bottom-up filling on a non-copper layer is possible with organic additives. Many conventional techniques for electroplating copper on non-copper layers have avoided incorporation of organic additives because high pH values and/complexing agents have interfered with bottom-up filling. However, the electroplating solution of the present disclosure promotes nucleation and bottom-up filling of copper on a non-copper layer with traditional organic additives. Accordingly, the electroplating solution of the present disclosure includes accelerators, suppressors, levelers, or combinations thereof. For example, the electroplating solution may include between about 10 ppm and about 500 ppm active organic additives. In some implementations, the concentration of accelerators may be equal to or less than about 100 ppm, or between about 5 ppm and about 40 ppm. In some implementations, the concentration of suppressors may be between about 30 ppm and about 300 ppm. In some implementations, the electroplating solution optionally includes levelers in addition to accelerators and suppressors.

FIGS. 8A-8D show the effects of low copper concentration, bromide ions as a complexing agent, and relatively high pH values on copper fill in features lined with cobalt. Cobalt serves as an example of a non-copper layer. FIGS. 8A-8D show progressive improvements in nucleation and fill of copper in the features.

Figure 8A:
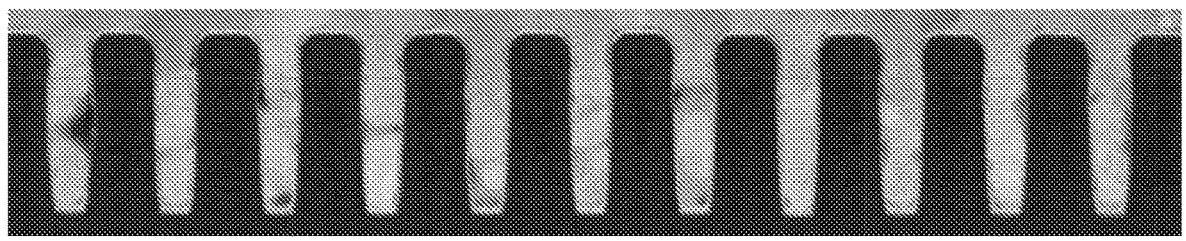
FIG. 8A shows a STEM image of copper fill in features lined with cobalt using a conventional copper electroplating solution.

FIG. 8A shows a STEM image of copper fill in features lined with cobalt using a traditional electroplating solution. Traditional electroplating solutions for damascene interconnects may have a copper concentration of about 10 g/L copper ion or higher. Without complexing agents like bromide ions, without a lower copper concentration, and with high acidity, electroplating of copper on cobalt results in poor nucleation and poor fill.

Figure 8B:
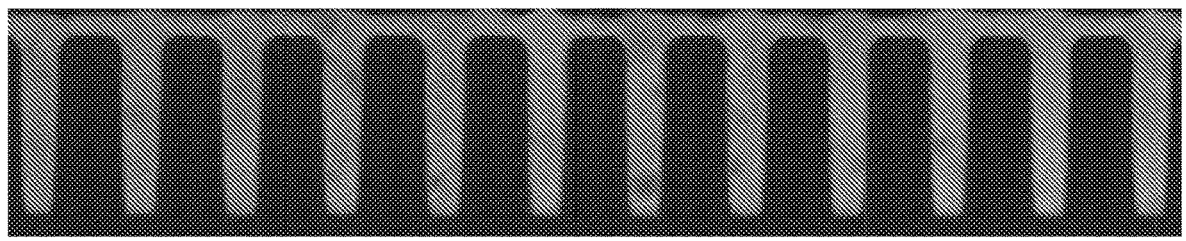
FIG. 8B shows a STEM image of copper fill in features lined with cobalt using a conventional copper electroplating solution with bromide ions as a complexing agent.

FIG. 8B shows a STEM image of copper fill in features lined with cobalt using a traditional electroplating solution with bromide ions as a complexing agent. The addition of bromide ions as a complexing agent increases the polarization of copper electroplating to promote nucleation. Complexing agents have shown to improve nucleation as depicted in FIG. 2 but have also shown to detrimentally affect fill as shown in FIG. 3. However, as shown in FIG. 6 and FIG. 8B, incorporation of bromide ions as a complexing agent in the electroplating solution not only improves copper nucleation but preserves or even improves copper fill.

Figure 8C:
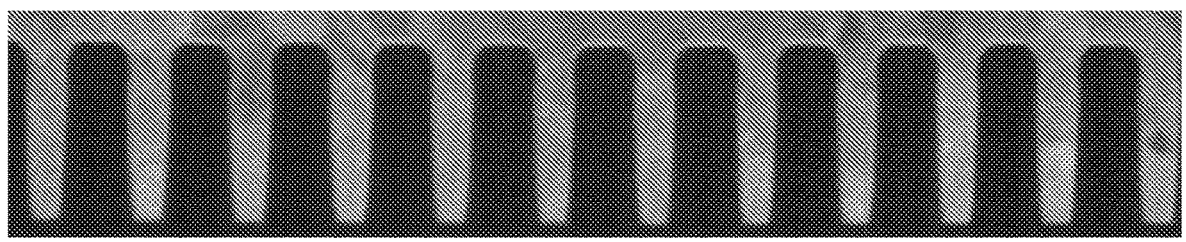
FIG. 8C shows a STEM image of copper fill in features lined with cobalt using a conventional copper electroplating solution with bromide ions and decreased copper ion concentration.

FIG. 8C shows a STEM image of copper fill in features lined with cobalt using a traditional electroplating solution with bromide ions and decreased copper ion concentration. Lowering copper ion concentration may further increase the overpotential of the electroplating solution to increase polarization on the plating surface. As shown in FIG. 8C, this further improves copper nucleation on a non-copper layer without sacrificing fill.

Figure 8D:
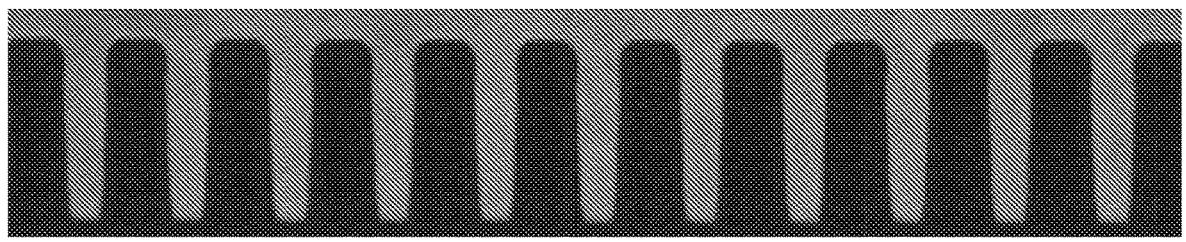
FIG. 8D shows a STEM image of copper fill in features lined with cobalt using a conventional copper electroplating solution with bromide ions, decreased copper ion concentration, and increased pH.

FIG. 8D shows a STEM image of copper fill in features lined with cobalt using a traditional electroplating solution with bromide ions, decreased copper ion concentration, and increased pH. Increased pH or lower acid concentration provides a lower conductivity electroplating solution for mitigating the terminal effect, thereby producing improved across-wafer uniformity. However, increased pH has typically resulted in poorer fill due to interference with organic additive activity. Nonetheless, as shown in FIG. 6 and FIG. 8D, incorporation of bromide ions as a complexing agent combined with increased pH not only improves copper nucleation but preserves or even improves copper fill.

Figure 9:
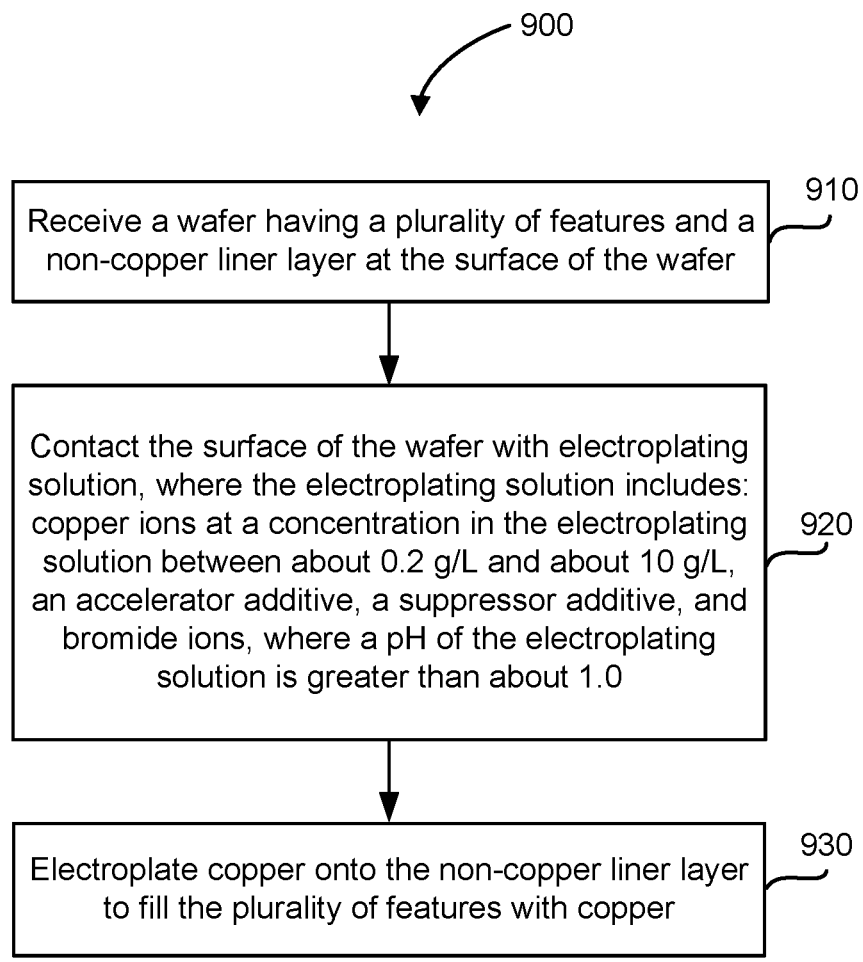
FIG. 9 shows a flow diagram of an example method of electroplating copper on a non-copper liner layer according to some implementations.

FIG. 9 shows a flow diagram of an example method of electroplating copper on a non-copper liner layer according to some implementations. The operations in a process 900 may be performed in different orders and/or with different, fewer, or additional operations.

At block 910 of the process 900, a wafer having a plurality of features is received. The wafer includes a non-copper liner layer at the surface of the wafer. The wafer includes features that are to be filled through an electroplating process. In some implementations, the features may be trenches or vias that are between about 5-100 nm wide, or between about 25-100 nm wide, or between 10-20 nm wide. Trenches, vias, and other recesses may sometimes be referred to as "features." The features may be damascene features. Currently, integrated circuit fabrication employs damascene, dual-damascene, or related technologies for electroplating copper into features that define interconnect paths.

In some implementations, the wafer includes a barrier layer and/or a liner layer to separate a copper fill from an insulating material. The features may be etched into the insulating material and the features may be lined with the barrier layer and/or the liner layer. Example materials for a barrier layer include tantalum, titanium, tantalum nitride, titanium nitride, and fluorine-free tungsten. Example materials for a liner layer include cobalt and ruthenium. The liner layer is a non-copper liner layer that has good adhesion to both the barrier material and copper, and typically has a resistivity greater than copper.

In some implementations, the wafer may be treated prior to contacting a surface of the wafer with electroplating solution. Treatment of the wafer may include a high temperature treatment to condition the surface of the wafer and decrease its resistance. In some implementations, treatment of the wafer may include exposing the non-copper liner layer with a plasma treatment (e.g., hydrogen plasma treatment) or a forming gas anneal to remove impurities, reduce oxides, and/or recrystallize the non-copper liner layer to improve conductivity and nucleation of copper.

At block 920 of the process 900, the surface of the wafer is contacted with electroplating solution, where the electroplating solution includes: copper ions at a concentration in the electroplating solution between about 0.2 g/L and about 10 g/L, an accelerator additive, a suppressor additive, and bromide ions. The pH of the electroplating solution is greater than about 1.0. In some implementations, a concentration of the bromide ions in the electroplating solution can be between about 20 mg/L and about 240 mg/L.

The electroplating solution achieves nucleation and bottom-up filling of copper on the non-copper liner layer with traditional organic additives. Accordingly, the electroplating solution includes the accelerator additive and the suppressor additive. In some implementations, the electroplating solution also includes a leveler additive. The electroplating solution also achieves nucleation and bottom-up filling of copper on the non-copper liner layer without prior deposition of a copper seed layer using a separate electrolyte or deposition process (e.g., PVD). Since the non-copper liner layer has a low conductivity, the electroplating solution has a low conductivity to mitigate the terminal effect. The electroplating solution may have a high pH for low conductivity, where the pH is equal to or greater than about 1.0, equal to or greater than about 1.5, or equal to or greater than about 2.0. In some implementations, the electroplating solution includes sulfuric acid or other suitable acid at a concentration between about 0.1 g/L and about 10 g/L. The electroplating solution includes copper ions at a low concentration to increase the polarization at the plating surface during electroplating. Thus, the electroplating solution has a low concentration of copper ions between about 0.2 g/L and about 10 g/L, or between about 0.2 g/L and about 5 g/L, or between about 0.2 g/L and about 3 g/L. The electroplating solution may include a copper salt such as copper sulfate, copper methanesulfonate, copper pyrophosphate, copper propanesulfonate, or copper sulfate heptahydrate. The electroplating solution includes a copper complexing agent that either does not interfere with or actively improves the activity of the organic additives. A first copper complexing agent includes a bromide ion, where a concentration of bromide ions in the electroplating solution may be between about 20 mg/L and about 240 mg/L, or between about 30 mg/L and about 200 mg/L, or between about 40 mg/L and about 160 mg/L. In some implementations, the bromide ions may be produced from hydrobromic acid (HBr) in the electroplating solution. The first copper complexing agent allows the organic additives to retain their effectiveness even at high pH values.

In some implementations, the electroplating solution further includes a second copper complexing agent. For example, the second copper complexing agent may include chloride ion. A concentration of the chloride ions in the electroplating solution may be between about 1 mg/L and about 100 mg/L, between about 10 mg/L and about 80 mg/L, or between about 20 mg/L and about 60 mg/L. In some implementations, the chloride ions may be produced from hydrochloric acid (HCl) in the electroplating solution. The second copper complexing agent serves to further increase the polarization of the plating surface during electroplating to promote copper nucleation.

At block 930 of the process 900, copper is electroplated onto the non-copper liner layer to fill the plurality of features with copper. The plurality of features are filled by bottom-up filling. Specifically, the copper is electroplated from the bottom to the top of the feature and avoids conformal deposition along the sidewalls and bottom of the feature. The copper fill in the plurality of features may be free of voids/seams or at least substantially free of voids/seams.

Obtaining bottom-up copper fill in the plurality of features may depend at least in part on the polarization at the plating surface. Polarization at the plating surface may protect against dissolution of the non-copper liner layer and may produce conditions that facilitate the activity of the organic additives for void-free bottom-up fill. Without being limited by any theory, the polarization may allow more accelerator molecules to accumulate at the bottom of the features. Void-free bottom-up filling correlates at least in part to how current density across the wafer surface is controlled. Hence, the waveform applied to drive electroplating may have an effect on the fill mechanism.

A process for immersing wafers into the electroplating solution may involve tilting the wafer away from horizontal. Consequently, the wafer will have a leading edge and a trailing edge during immersion. If a constant current bias is applied to the wafer during immersion, the leading edge will experience a very high current density until most or all of the wafer is immersed. Even if the high current density does not damage the leading edge of the wafer, the higher current densities during entry result in leading edge portions of the wafer having higher rates of copper deposition and a non-uniform thickness over the wafer surface. Thus, careful control of the current density across the wafer surface is beneficial, particularly during wafer entry.

Potentiostatic wafer entry may be used to help control the current density across the wafer during immersion. Potentiostatic entry involves application of a constant potential to the wafer during the entire course of entry into the electroplating solution. The application of the constant potential may be achieved by pre-setting a power supply connected to the wafer according to the constant potential. Potentiostatic control may be maintained with a constant potential between about −400 mV and about −2000 mV with respect to a reference electrode (e.g., mercury sulfate reference electrode). In some implementations, potentiostatic control during entry produces current densities of about 1 mA/cm$^2$ to about 40 mA/cm$^2$ across the wafer surface. In some implementations, application of a constant potential may occur during wafer entry and/or during a conditioning period. A conditioning step may be applied to a wafer during a conditioning period for creating a correct distribution of organic additives in the features. Thus, the conditioning step may provide correctly control current density during wafer entry and provide a correct distribution of the organic additives. The conditioning period may serve as a current or potential controlled plating period. Accordingly, potentiostatic control can provide an overpotential that serves as a useful conditioning step when the wafer is immersed in the electroplating solution. In some implementations, the application of the constant potential may be held for a duration between about 0.5 seconds and about 10 seconds for the conditioning step. The conditioning step generally does not exceed 10 seconds. In some implementations, conditioning the wafer by application of a constant potential promotes nucleation without interfering with the activity of the organic additives.

In some implementations, no constant potential is applied to the wafer when the wafer is immersed in the electroplating solution. In other words, there is no fixed potential applied during the conditioning step as the wafer is being immersed in the electroplating solution. Without application of the constant potential, the voltage is set to an open-circuit voltage, which is the voltage with respect to the reference electrode when no current is passed.

In some implementations, pulses of current may be applied to the wafer when the wafer is immersed in the electroplating solution. This may occur during the conditioning step and/or during wafer entry as the wafer is being immersed in the electroplating solution. The pulses of current may be galvanodynamically or potentiodynamically controlled. The pulses of current may include stripping currents or potentials to remove projecting regions of copper being deposited. The pulses of current may be relatively high current pulses, low current pulses, or no current pulses. Without wishing to be bound by any theory or mechanism of action, it is believed that controlling the pulses of current may be used to alter the initial copper nucleation of the wafer by redistributing the organic additives adsorbed on the wafer surface.

In some implementations, controlling current density across the wafer surface involves dynamically controlling the current applied to the wafer. This may be referred to as galvanodynamic control. Particularly when the wafer is immersed by angled immersion so that the wafers enter the electroplating solution at a slight angle, the surface area of the wafer immersed in the electroplating solution increases over the course of immersion. Entry methods that provide control of the current as a function of immersed area may provide better control of film uniformity and morphology than conventional entry methods. In some implementations, current densities may be between about 0.1 mA/cm$^2$ and about 500 mA/cm$^2$.

The waveform applied to the wafer may be different during a nucleation period than for a fill period. The nucleation period describes the period in which copper nucleation occurs on the non-copper liner layer and the fill period describes the period that follows the nucleation period for bottom-up copper fill. The conditioning step represents a potential or current controlled plating step that may overlap with one or both of the nucleation period and the fill period. However, where the conditioning step is set to an open circuit voltage, for example, it is not nucleating anything and would not overlap with the nucleation period.

In some implementations, the waveform applied to the wafer during the nucleation period and the fill period is galvanostatically controlled. Galvanostatic control delivers constant current to the wafer when the wafer is immersed in the electroplating solution. Controlling current density across the wafer surface may involve applying a constant current to the wafer. In some implementations, a DC current is used. The DC current may provide a constant current at a current density between about 0.2 mA/cm$^2$ and about 5 mA/cm$^2$. During the nucleation period and the fill period, the rotations per minute (RPM) of the wafer may be between about 0 and 200.

In some implementations, the waveform applied to the wafer during the nucleation period and the fill period is potentiostatically controlled. Potentiostatic control may control an amount of energy at the wafer surface more effectively than galvanostatic control. In some implementations, potentiostatic control applies a constant potential at a particular setpoint between about −400 mV and about −2000 mV with respect to a reference electrode such as a Hg$_2$/Hg$_2$SO$_4$ electrode.

In some implementations where control of the current density across the wafer surface involves galvanodynamic or potentiodynamic control, a different current profile or voltage profile may be applied during a nucleation period than a fill period. Thus, a ramp up or a ramp down of current or potential may occur depending on whether electroplating is in its early stages or in its later stages. In some implementations, the process 900 further includes ramping up or down a current or potential during a nucleation period, and ramping up or down the current or potential during a fill period subsequent to the nucleation period. In some implementations, the current or potential is ramped up or down in small increments/steps.

Apparatus for Electroplating

Many apparatus configurations may be used in accordance with the embodiments described herein. One example apparatus includes a clamshell fixture that seals a wafer's backside away from the plating solution while allowing plating to proceed on the wafer's face. The clamshell fixture may support the wafer, for example, via a seal placed over the bevel of the wafer, or by means such as a vacuum applied to the back of a wafer in conjunction with seals applied near the bevel.

The clamshell fixture should enter the bath in a way that allows good wetting of the wafer's plating surface. The quality of substrate wetting is affected by multiple variables including, but not limited to, clamshell rotation speed, vertical entry speed, and the angle of the clamshell relative to the surface of the plating bath. These variables and their effects are further discussed in U.S. Pat. No. 6,551,487, incorporated by reference herein. In certain implementations, the electrode rotation rate is between about 5-125 RPM, the vertical entry speed is between about 5-300 mm/s, and the angle of the clamshell relative to the surface of the plating bath is between about 1-10 degrees. One of the goals in optimizing these variables for a particular application is to achieve good wetting by fully displacing air from the wafer surface.

Figure 10:
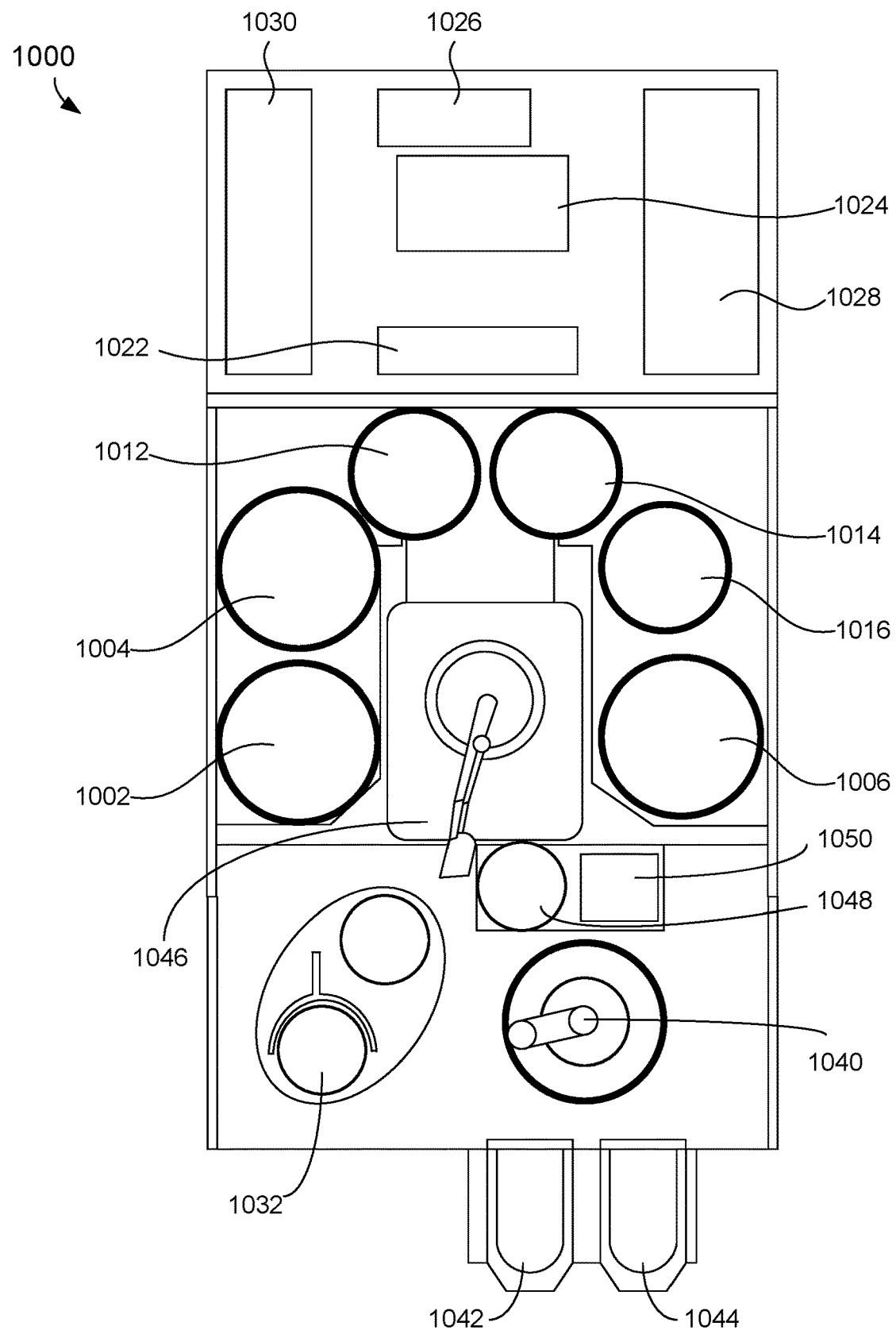
FIG. 10 shows a schematic of a top view of an example electrodeposition apparatus according to some implementations.

The electrodeposition methods disclosed herein can be described in reference to, and may be employed in the context of, various electroplating tool apparatuses. One example of a plating apparatus that may be used according to the embodiments herein is the Lam Research Sabre tool. Electrodeposition, including substrate immersion, and other methods disclosed herein can be performed in components that form a larger electrodeposition apparatus. FIG. 10 shows a schematic of a top view of an example electrodeposition apparatus. The electrodeposition apparatus 1000 can include three separate electroplating modules 1002, 1004, and 1006. The electrodeposition apparatus 1000 can also include three separate modules 1012, 1014, and 1016 configured for various process operations. For example, in some embodiments, one or more of modules 1012, 1014, and 1016 may be a spin rinse drying (SRD) module. In other embodiments, one or more of the modules 1012, 1014, and 1016 may be post-electrofill modules (PEMs), each configured to perform a function, such as edge bevel removal, backside etching, and acid cleaning of substrates after they have been processed by one of the electroplating modules 1002, 1004, and 1006.

The electrodeposition apparatus 1000 includes a central electrodeposition chamber 1024. The central electrodeposition chamber 1024 is a chamber that holds the chemical solution used as the electroplating solution in the electroplating modules 1002, 1004, and 1006. The electrodeposition apparatus 1000 also includes a dosing system 1026 that may store and deliver additives for the electroplating solution. A chemical dilution module 1022 may store and mix chemicals to be used as an etchant. A filtration and pumping unit 1028 may filter the electroplating solution for the central electrodeposition chamber 1024 and pump it to the electroplating modules.

A system controller 1030 provides electronic and interface controls required to operate the electrodeposition apparatus 1000. The system controller 1030 (which may include one or more physical or logical controllers) controls some or all of the properties of the electroplating apparatus 1000. The system controller 1030 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1030 or they may be provided over a network. In certain embodiments, the system controller 1030 executes system control software.

The system control software in the electrodeposition apparatus 1000 may include instructions for controlling the timing, mixture of electrolyte components (including the concentration of one or more electrolyte components), inlet pressure, plating cell pressure, plating cell temperature, substrate temperature, current and potential applied to the substrate and any other electrodes, substrate position, substrate rotation, and other parameters of a particular process performed by the electrodeposition apparatus 1000. The system control logic may also include instructions for electroplating under conditions that are tailored to be appropriate for a low copper concentration electrolyte and the high overpotential associated therewith. For example, the system control logic may be configured to provide a relatively low current density during the bottom-up fill stage and/or a higher current density during the overburden stage. The control logic may also be configured to provide certain levels of mass transfer to the wafer surface during plating. For example, the control logic may be configured to control the flow of electrolyte to ensure sufficient mass transfer to the wafer during plating such that the substrate does not encounter depleted copper conditions. In certain embodiments the control logic may operate to provide different levels of mass transfer at different stages of the plating process (e.g., higher mass transfer during the bottom-up fill stage than during the overburden stage, or lower mass transfer during the bottom-up fill stage than during the overburden stage). Further, the system control logic may be configured to maintain the concentration of one or more electrolyte components within any of the ranges disclosed herein. As a particular example, the system control logic may be designed or configured to maintain the concentration of copper cations between about 1-10 g/L. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 1030. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 1030. The user interface may include a display screen, graphical software displays of the apparatus and/or process conditions, and user input devices such as pointing devices, keyboards, touch screens, microphones, etc.

In some embodiments, parameters adjusted by the system controller 1030 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1030 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment, the instructions can include inserting the substrate in a wafer holder, tilting the substrate, biasing the substrate during immersion, and electrodepositing a copper containing structure on a substrate.

A hand-off tool 1040 may select a substrate from a substrate cassette such as the cassette 1042 or the cassette 1044. The cassettes 1042 or 1044 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1040 may hold the substrate using a vacuum attachment or some other attaching mechanism.

The hand-off tool 1040 may interface with a wafer handling station 1032, the cassettes 1042 or 1044, a transfer station 1050, or an aligner 1048. From the transfer station 1050, a hand-off tool 1046 may gain access to the substrate. The transfer station 1050 may be a slot or a position from and to which hand-off tools 1040 and 1046 may pass substrates without going through the aligner 1048. In some embodiments, however, to ensure that a substrate is properly aligned on the hand-off tool 1046 for precision delivery to an electroplating module, the hand-off tool 1046 may align the substrate with an aligner 1048. The hand-off tool 1046 may also deliver a substrate to one of the electroplating modules 1002, 1004, or 1006 or to one of the three separate modules 1012, 1014, and 1016 configured for various process operations.

An example of a process operation according to the methods described above may proceed as follows: (1) electrodeposit copper onto a substrate to form a copper containing structure in the electroplating module 1004; (2) rinse and dry the substrate in SRD in module 1012; and, (3) perform edge bevel removal in module 1014.

An apparatus configured to allow efficient cycling of substrates through sequential plating, rinsing, drying, and PEM process operations may be useful for implementations for use in a manufacturing environment. To accomplish this, the module 1012 can be configured as a spin rinse dryer and an edge bevel removal chamber. With such a module 1012, the substrate would only need to be transported between the electroplating module 1004 and the module 1012 for the copper plating and EBR operations.

In some implementations, a controller (e.g., system controller 1030) is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 11:
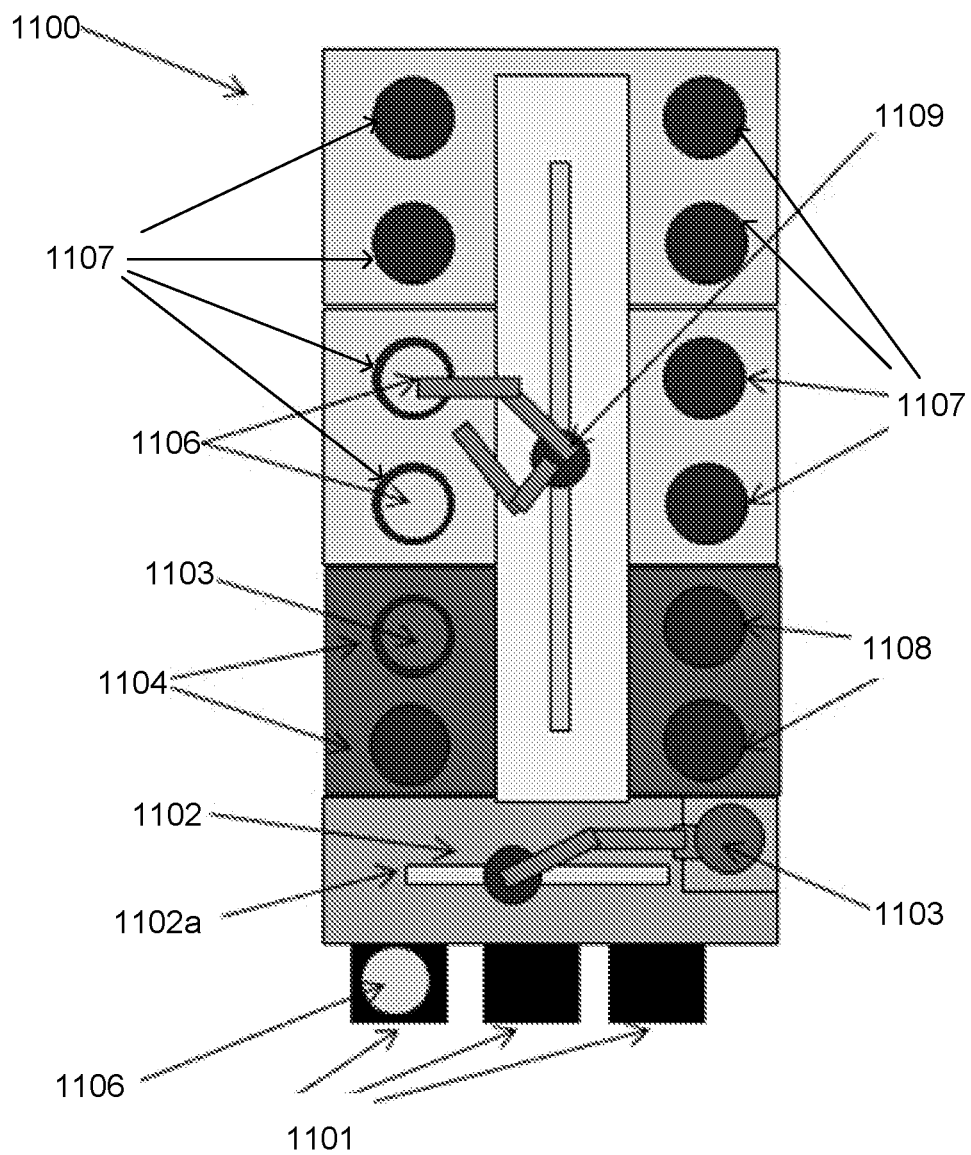
FIG. 11 shows a schematic of a top view of an alternative example electrodeposition apparatus.

An alternative embodiment of an electrodeposition apparatus 1100 is schematically illustrated in FIG. 11. In this embodiment, the electrodeposition apparatus 1100 has a set of electroplating cells 1107, each containing an electroplating bath, in a paired or multiple "duet" configuration. In addition to electroplating per se, the electrodeposition apparatus 1100 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1100 is shown schematically looking top down in FIG. 11, and only a single level or "floor" is revealed in the figure, but it is to be readily understood by one having ordinary skill in the art that such an apparatus, e.g. the Novellus Sabre™ 3D tool, can have two or more levels "stacked" on top of each other, each potentially having identical or different types of processing stations.

Referring once again to FIG. 11, the substrates 1106 that are to be electroplated are generally fed to the electrodeposition apparatus 1100 through a front end loading FOUP 1101 and, in this example, are brought from the FOUP to the main substrate processing area of the electrodeposition apparatus 1100 via a front-end robot 1102 that can retract and move a substrate 1106 driven by a spindle 1103 in multiple dimensions from one station to another of the accessible stations—two front-end accessible stations 1104 and also two front-end accessible stations 1108 are shown in this example. The front-end accessible stations 1104 and 1108 may include, for example, pre-treatment stations, and spin rinse drying (SRD) stations. Lateral movement from side-to-side of the front-end robot 1102 is accomplished utilizing robot track 1102a. Each of the substrates 1106 may be held by a cup/cone assembly (not shown) driven by a spindle 1103 connected to a motor (not shown), and the motor may be attached to a mounting bracket 1109. Also shown in this example are the four "duets" of electroplating cells 1107, for a total of eight electroplating cells 1107. The electroplating cells 1107 may be used for electroplating copper for the copper containing structure and electroplating solder material for the solder structure. A system controller (not shown) may be coupled to the electrodeposition apparatus 1100 to control some or all of the properties of the electrodeposition apparatus 1100. The system controller may be programmed or otherwise configured to execute instructions according to processes described earlier herein.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

In the foregoing description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations are described in conjunction with the specific implementations, it will be understood that it is not intended to limit the disclosed implementations.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of electroplating copper onto a surface of a wafer, the method comprising:
   receiving a wafer having a plurality of features and a cobalt liner layer at the surface of the wafer; and
   contacting the surface of the wafer with electroplating solution, wherein the electroplating solution comprises:
      copper ions at a concentration in the electroplating solution between 0.2 g/L and 3 g/L;
      an accelerator additive;
      a suppressor additive;
      a first non-organic complexing agent comprising bromide ions, wherein a concentration of the bromide ions in the electroplating solution is between 30 mg/L and 200 mg/L,
      an acid, wherein a pH of the electroplating solution is greater than 2.0, wherein a concentration of the acid in the electroplating solution is between 0.5 g/L and 5 g/L; and
      a second non-organic complexing agent comprising chloride ions; and
   electroplating copper onto the cobalt liner layer to fill the plurality of features with copper.

2. The method of claim 1, wherein the electroplating solution further comprises:
   a leveler additive.

3. The method of claim 1, wherein a concentration of the chloride ions in the electroplating solution is between 1 mg/L and 100 mg/L.

4. The method of claim 1, wherein the electroplating solution is configured to induce a cathodic overpotential on the cobalt liner layer sufficient to prevent dissolution of the cobalt liner layer.

5. The method of claim 1, wherein the plurality of features filled with copper is free of voids or substantially free of voids.

6. The method of claim 1, further comprising:
   applying, before or upon contacting the surface of the wafer with the electroplating solution, a constant potential between −400 mV and −2000 mV relative to Hg/HgSO$_4$ to the wafer.

7. The method of claim 1, wherein contacting the surface of the wafer with the electroplating solution occurs at an open circuit voltage.

8. The method of claim 1, further comprising:
   applying, before or upon contacting the surface of the wafer with the electroplating solution, a series of pulses of current that are galvanodynamically or potentiodynamically controlled.

9. The method of claim 1, wherein electroplating the copper onto the cobalt liner layer comprises:
   ramping up or down a current or potential during a nucleation period; and
   ramping up or down the current or potential during a fill period subsequent to the nucleation period.

10. The method of claim 1, wherein electroplating the copper onto the cobalt liner layer occurs without depositing a copper seed layer.

11. The method of claim 1, further comprising:
treating, prior to contacting the surface of the wafer with the electroplating solution, the
wafer with a forming gas anneal or plasma to remove impurities, reduce oxides, and/or
recrystallize the cobalt liner layer on the surface of the wafer.

\* \* \* \* \*